(12) United States Patent
Lin

(10) Patent No.: US 9,305,902 B1
(45) Date of Patent: Apr. 5, 2016

(54) CHIP PACKAGE AND METHOD FOR FORMING THE SAME

(71) Applicant: NANYA TECHNOLOGY CORPORATION, Taoyuan (TW)

(72) Inventor: Po Chun Lin, Changhua County (TW)

(73) Assignee: NANYA TECHNOLOGY CORPORATION, Tao-Yuan (TW)

( * ) Notice: Subject to any disclaimer, the term of this patent is extended or adjusted under 35 U.S.C. 154(b) by 0 days.

(21) Appl. No.: 14/964,464

(22) Filed: Dec. 9, 2015

Related U.S. Application Data

(62) Division of application No. 14/034,975, filed on Sep. 24, 2013, now Pat. No. 9,240,381.

(51) Int. Cl.
*H01L 21/00* (2006.01)
*H01L 25/065* (2006.01)
*H01L 25/00* (2006.01)

(52) U.S. Cl.
CPC ............ *H01L 25/0657* (2013.01); *H01L 25/50* (2013.01); *H01L 2225/06513* (2013.01); *H01L 2225/06544* (2013.01)

(58) Field of Classification Search
CPC ............ H01L 23/481; H01L 23/49827; H01L 23/5384
USPC .................................. 257/686, 758, 773, 777
See application file for complete search history.

(56) References Cited

U.S. PATENT DOCUMENTS

| | | | | |
|---|---|---|---|---|
| 6,064,114 A | * | 5/2000 | Higgins, III | ........ H01L 23/3114 257/698 |
| 6,448,661 B1 | * | 9/2002 | Kim | ...................... H01L 23/481 257/686 |
| 7,148,554 B2 | * | 12/2006 | Nah | ...................... H05K 1/0206 257/528 |
| 8,674,482 B2 | * | 3/2014 | Shi | .................... H01L 21/76898 257/621 |
| 2006/0267212 A1 | * | 11/2006 | Shibata | .................. H01L 23/544 257/777 |
| 2009/0008793 A1 | * | 1/2009 | Pohl | ...................... H01L 21/568 257/777 |
| 2012/0119357 A1 | * | 5/2012 | Byeon | ................. H01L 25/0657 257/737 |
| 2012/0138925 A1 | * | 6/2012 | Oh | ...................... H01L 21/6835 257/48 |
| 2013/0069242 A1 | * | 3/2013 | Yuh | ........................ H01L 23/481 257/774 |
| 2013/0169343 A1 | * | 7/2013 | Gillingham | .............. G11C 5/02 327/365 |

* cited by examiner

*Primary Examiner* — Meiya Li
*Assistant Examiner* — Peter M Albrecht
(74) *Attorney, Agent, or Firm* — WPAT, P.C.; Anthony King

(57) ABSTRACT

A semiconductor device includes a plurality of conductors for connecting another semiconductor device. Each conductor connects to a chip select pad within the semiconductor device through an upper vertical connection formed through an insulation layer formed on a substrate or connected to a straight vertical connection formed through the substrate and the insulation layer. The semiconductor device further includes a plurality of lower vertical connections formed through the substrate and correspondingly connecting to the chip select pads and a chip select terminal. The chip select terminal electrically connects to the die circuit of the semiconductor device while the chip select pads are electrically isolated from the die circuit. The lower vertical connections and the straight vertical connection can be arranged in two dimensions.

10 Claims, 10 Drawing Sheets

CHIP PACKAGE AND METHOD FOR FORMING THE SAME

This application is a divisional of U.S. patent application Ser. No. 14/034,975, filed Sep. 24, 2013.

BACKGROUND OF THE INVENTION

1. Technical Field

The present invention relates to a chip package including stacking semiconductor devices and a method for forming the same.

2. Background

A three-dimensional integrated circuit is built by stacking dies and interconnecting them vertically such that they can behave as a single device. The stacked dies can be interconnected using TSV (through silicon via) technology such that the three-dimensional integrated circuit can have a small footprint.

Normally, TSVs are extremely large; they are a few times larger than gates and memory cells. Furthermore, when TSVs are fabricated, tensile stresses occur around the TSVs, which may cause significant carrier mobility variation. A keep-out zone surrounding a TSV is introduced to prevent devices or cells from being influenced by the TSV-induced stresses.

A conventional three-dimensional integrated circuit has a chip select mechanism, which uses TSVs as a vertical connection. Usually, the TSVs are arranged along one direction. Due to the large sizes of the TSVs and the keep-out zones they create, the linearly arranged TSVs consume a large die area, resulting in a large die or limiting the number of dies to be stacked in the three-dimensional integrated circuit.

SUMMARY

One embodiment of the present invention discloses a chip package comprising at least one semiconductor device. The semiconductor device comprises a die, a chip select terminal, a plurality of chip select pads, a first lower vertical connection, a plurality of second lower vertical connections, an insulation layer, a plurality of upper vertical connections, a vertical connection, and a plurality of conductors. The die comprises a die circuit and a substrate. The chip select terminal is formed on the substrate and electrically connected to the die circuit. The plurality of chip select pads are formed on the substrate and electrically isolated from the die circuit. The first lower vertical connection is formed through the substrate and connected to the chip select terminal. The plurality of second lower vertical connections are formed through the substrate and correspondingly connected to the plurality of chip select pads. The insulation layer is formed on the substrate. The plurality of upper vertical connections are formed through the insulation layer and correspondingly connected to the plurality of chip select pads. The vertical connection goes straight through the substrate and the insulation layer. The plurality of conductors are formed on the insulation layer, wherein each conductor connects to a corresponding one of the upper vertical connections and the vertical connection. Each conductor extends to a location above a corresponding one of the first and second lower vertical connections. The first lower vertical connection, the second lower vertical connections, and the vertical connection are arranged in two dimensions.

One embodiment of the present invention discloses a method for forming a chip package. The method comprises forming a first lower vertical connection, a plurality of second lower vertical connections, and a third lower vertical connection in a substrate of a semiconductor device; forming a chip select terminal and a plurality of chip select pads on the substrate, wherein the chip select terminal connects to the first lower vertical connection, and the plurality of chip select pads correspondingly connect to the plurality of second lower vertical connections; forming an insulation layer on the substrate; forming a plurality of upper vertical connections in the insulation layer, wherein the plurality of upper vertical connections correspondingly connect to the plurality of chip select pads and the third lower vertical connection, and in which the third lower vertical connection and the upper vertical connection connecting to the third lower vertical connection form a straight vertical connection; and forming a plurality of conductors on the insulation layer, wherein the plurality of conductors correspondingly connect to the plurality of upper vertical connections and the straight vertical connection; wherein the first lower vertical connection, the plurality of second lower vertical connections and the third lower vertical connection are arranged in two dimensions.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1:
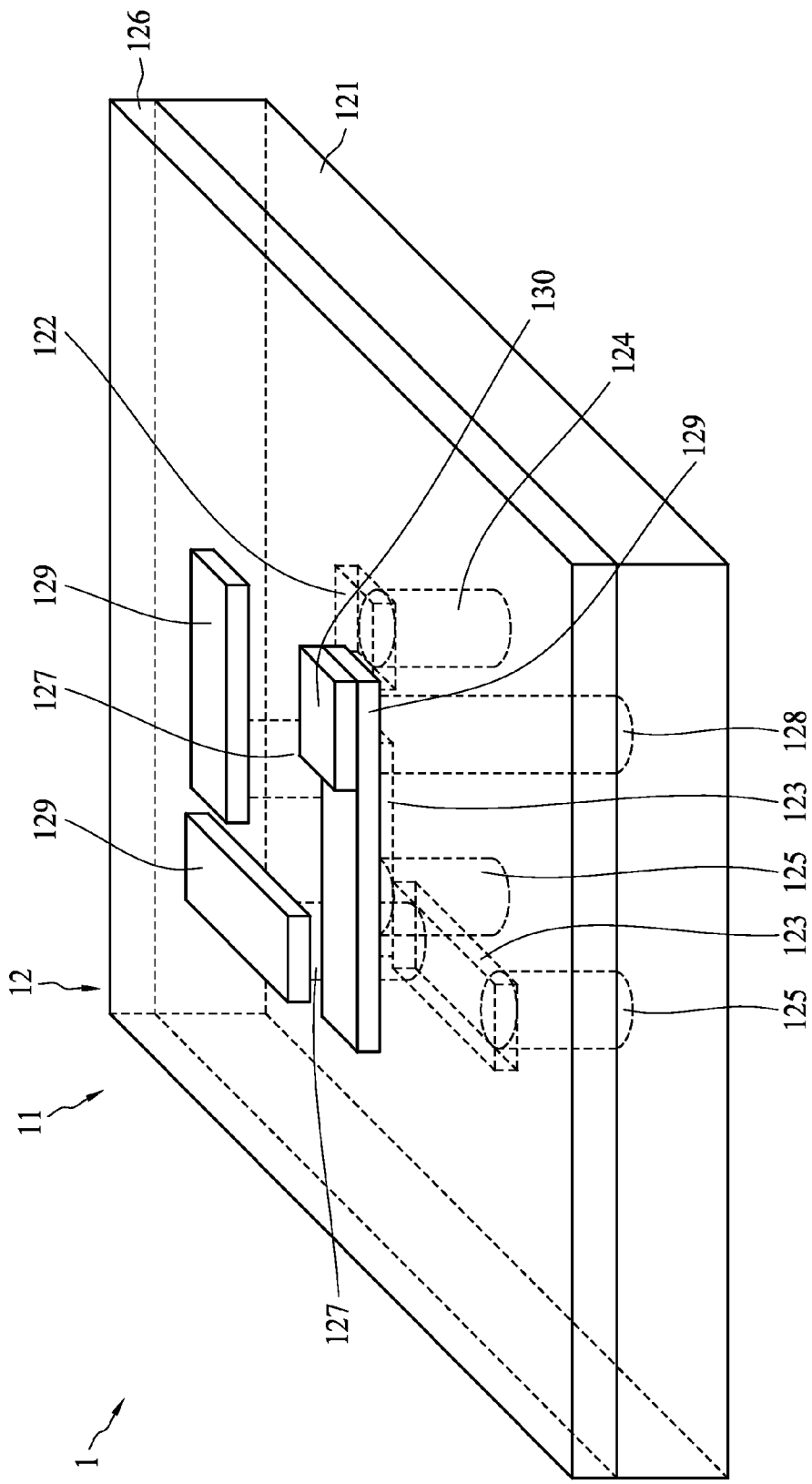
FIG. 1 schematically shows a semiconductor device of a chip package according to one embodiment of the present invention.

FIG. 1 schematically shows a semiconductor device 11 of a chip package 1 according to one embodiment of the present invention. As shown in FIG. 1, the chip package 1 comprises at least one semiconductor device 11. In one embodiment, the chip package 1 comprises a plurality of semiconductor devices 11, which can be stacked in the chip package 1 and electrically connected to each other.

The semiconductor device 11 may comprise a die 12. The die 12 may be separated from a wafer comprising a plurality of dies, wherein each die comprises a copy of a given function of a die circuit. The die 12 can comprise a substrate 121, on which the die circuit is built.

The substrate 121 may comprise semiconductor material such as silicon material or the like.

Referring to FIG. 1, the semiconductor device 11 may comprise a chip select (CS) terminal 122. The chip select terminal 122 may be formed on the substrate 121 and connected to the entire die circuit of the die 12. The chip select terminal 122 is an access-enable switch. When the chip select terminal 122 is held in an active state, the semiconductor device 11 responds to changes on its input terminals, such as data or address information for a RAM device, and drives any output terminals. When the chip select terminal 122 is held in an inactive state, the semiconductor device 11 ignores any changes in the state of its input terminals and its outputs are in a high impedance state.

In one embodiment, the chip select terminal 122 comprises metal such as, but not limited to, copper or tungsten.

The semiconductor device 11 may comprise at least one chip select pad 123. The chip select pad 123 can be formed on the substrate 121 and does not connect to, or is electrically isolated from, the die circuit of the die 12.

The semiconductor device 11 may comprise a first lower vertical connection 124. The first lower vertical connection 124 can be formed through the substrate 121 and connected to the chip select terminal 122. After the semiconductor device 11 is stacked, signals can be supplied from an underlying semiconductor device or circuit board, through the first lower vertical connection 124, to the chip select terminal 122.

The semiconductor device 11 may comprise at least one second lower vertical connection 125. The at least one second lower vertical connection 125 can be formed through the substrate 121 and correspondingly connected to the at least one chip select pad 123.

The semiconductor device 11 may comprise an insulation layer 126. The insulation layer 126 can be formed on the substrate 121 and at least cover the chip select terminal 122 and the chip select pad 123.

The semiconductor device 11 may comprise at least one upper vertical connection 127 corresponding to the at least one chip select pad 123. The at least one upper vertical connection 127 correspondingly connects to the at least one chip select pad 123 and is formed through the insulation layer 126.

The semiconductor device 11 may comprise a vertical connection 128 that is formed through the substrate 121 and the insulation layer 126.

The semiconductor device 11 may comprise a plurality of conductors 129 formed on the insulation layer 126. Each conductor 129 connects to a corresponding one of the at least one upper vertical connection 127 and the vertical connection 128, and extends to a location above a corresponding one of the first lower vertical connection 124 and the at least one second lower vertical connection 125.

As shown in FIG. 1, the first lower vertical connection 124, the at least one second lower vertical connection 125, and the vertical connection 128 are arranged in two dimensions. Thus, the first lower vertical connection 124, the at least one second lower vertical connection 125, and the vertical connection 128 encompass less area.

In one embodiment, the first lower vertical connection 124, the at least one second lower vertical connection 125, and the vertical connection 128 can be arranged in a matrix. In one embodiment, the first lower vertical connection 124, the at least one second lower vertical connection 125, and the vertical connection 128 can be arranged in a rectangular or round ring. In one embodiment, the first lower vertical connection 124, the at least one second lower vertical connection 125, and the vertical connection 128 can be arranged in a U pattern, V pattern, or an arbitrary pattern.

Referring to FIG. 1, in one embodiment, the conductors 129 can extend in different directions. In one embodiment, at least two of the conductors 129 can extend in different directions. In one embodiment, at least two of the conductors 129 can extend perpendicularly to each other.

Referring to FIG. 1, in one embodiment, the semiconductor device 11 may comprise an insulation pad 130 that is formed on the conductor 129 connected with the vertical connection 128. The insulation pad 130 can prevent the signal transmitting through the vertical connection 128 of a lower semiconductor device 11 from transmitting through the vertical connection 128 of an upper semiconductor device 11. In one embodiment, the insulation pad 130 is formed to only cover a portion of the conductor 129 connected with the vertical connection 128, or the insulation pad 130 is smaller than the corresponding conductor 129.

Figure 2A:
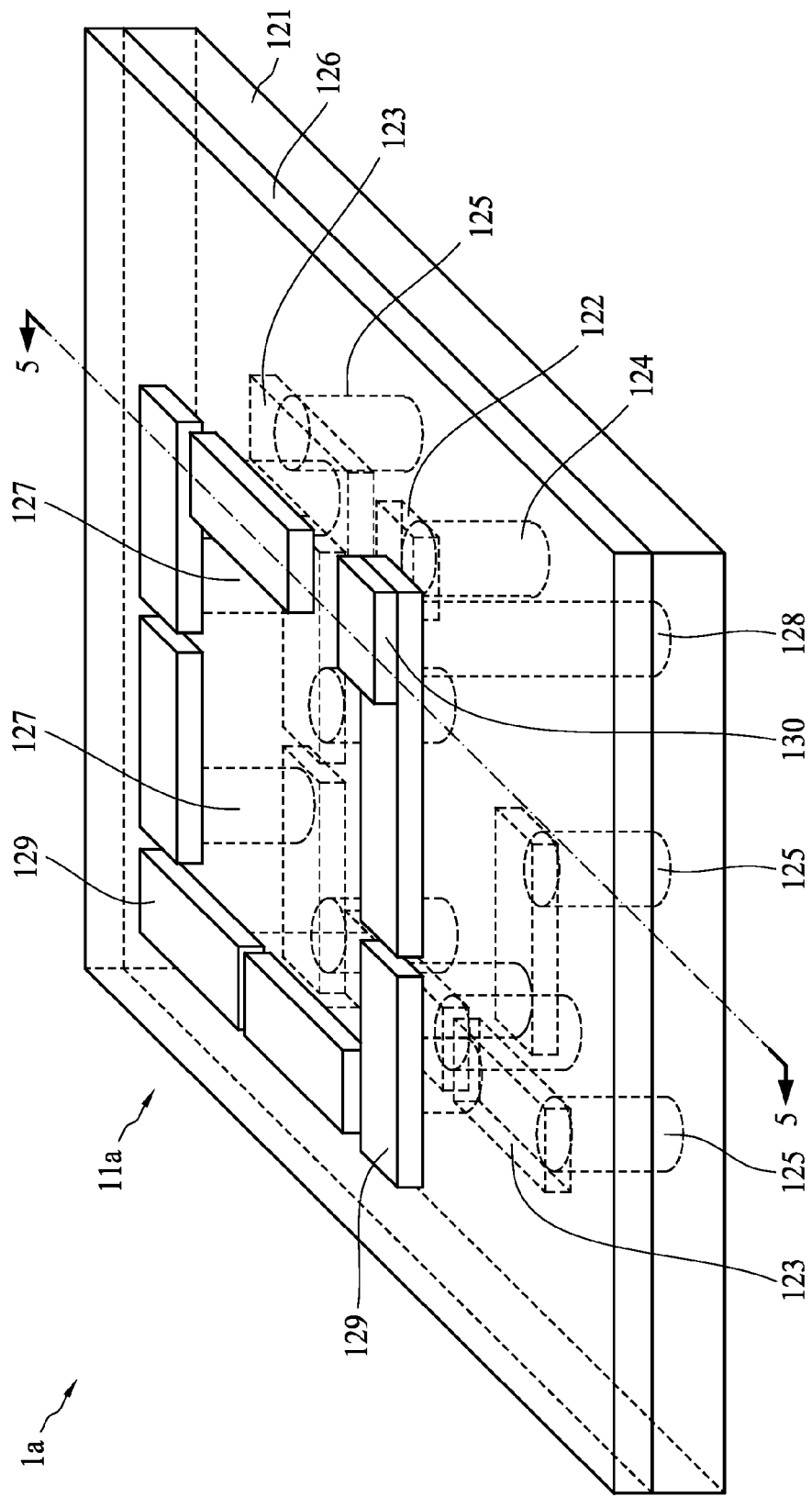
FIG. 2A schematically shows a semiconductor device of a chip package according to another embodiment of the present invention.

FIG. 2A schematically shows a semiconductor device 11a of a chip package 1a according to another embodiment of the present invention. Referring to FIG. 2A, the semiconductor device 11a of the chip package 1a comprises more chip select pads 123, second lower vertical connections 125, upper vertical connections 127 and conductors 129 than the semiconductor device 11 of the chip package 1. The first lower vertical connection 124, the second lower vertical connections 125, and the vertical connection 128 can be arranged in a rectangular ring or loop.

Referring to FIG. 2A, in one embodiment, the semiconductor device 11a may comprise an insulation pad 130 that is formed on the conductor 129 connected with the vertical connection 128. In one embodiment, the insulation pad 130 is formed to only cover a portion of the conductor 129 connected with the vertical connection 128.

Figure 2B:
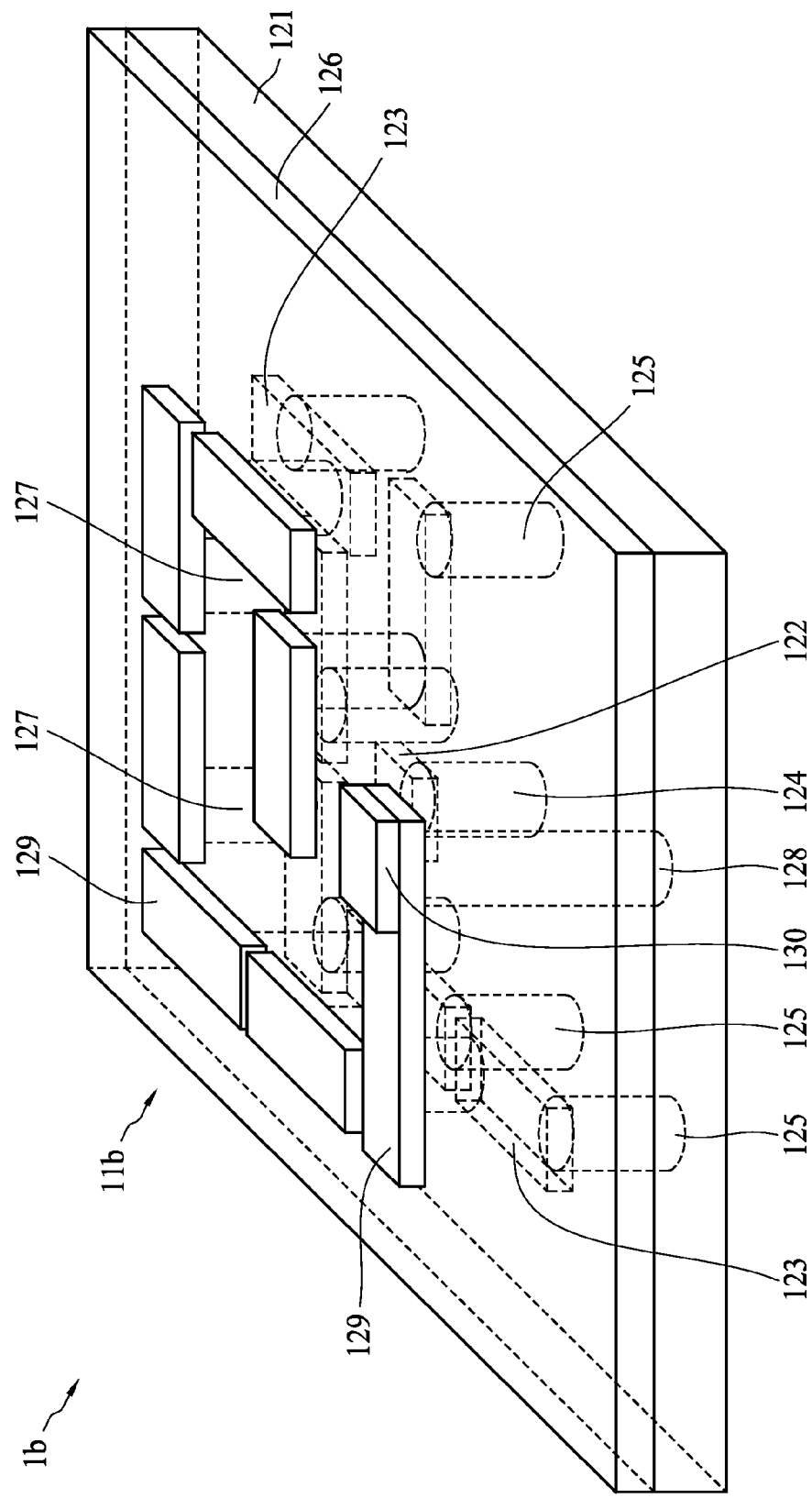
FIG. 2B schematically shows a semiconductor device of a chip package according to another embodiment of the present invention.

FIG. 2B schematically shows a semiconductor device 11b of a chip package 1b according to another embodiment of the present invention. Referring to FIG. 2B, the semiconductor device 11b of the chip package 1b has the same number of second lower vertical connections 125, chip select pads 123, upper vertical connections 127, and conductors 129 as the semiconductor device 11a of a chip package 1a. However, the location of the chip select terminal 122 of the semiconductor device 11b is different from that of the chip select terminal 122 of the semiconductor device 11a, and one chip select pad 123 of the semiconductor device 11b is relocated. In one embodiment, within the semiconductor device 11b, the second lower vertical connections 125 and the vertical connection 128 are formed around the first lower vertical connection 124, and the conductors 129 are accordingly arranged in a spiral shape. In one embodiment, the conductors 129 can be arranged in a rectangular spiral shape. In one embodiment, the conductors 129 can be arranged in a circular spiral shape. In one embodiment, the conductors 129 can be arranged in a non-circular spiral shape.

Referring to FIG. 2B, in one embodiment, the semiconductor device 11b may comprise an insulation pad 130 that is formed on the conductor 129 connected with the vertical connection 128. In one embodiment, the insulation pad 130 is formed to only cover a portion of the conductor 129 connected with the vertical connection 128.

Figure 3:
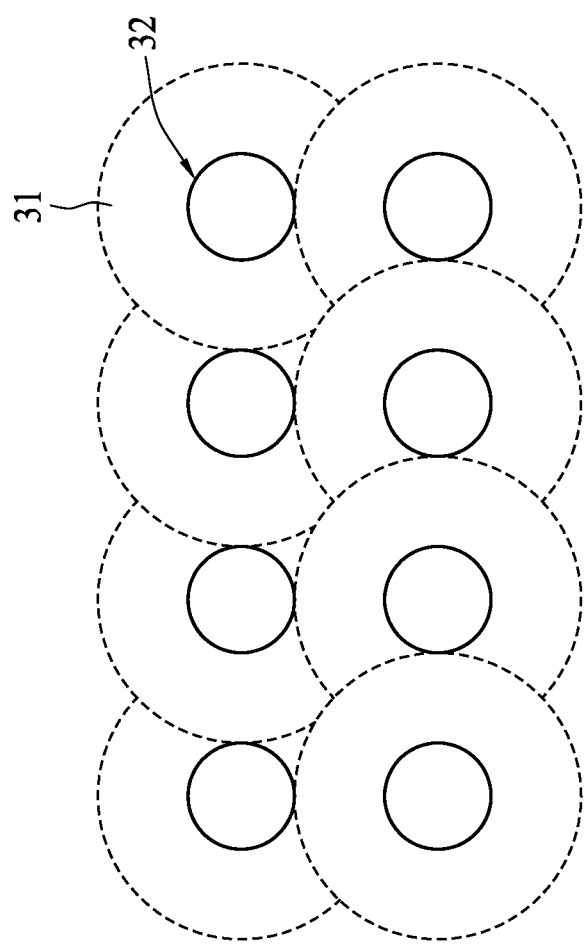
FIG. 3 schematically shows the arrangement of a plurality of vertical connections according to one embodiment of the present invention.

FIG. 3 schematically shows the arrangement of a plurality of vertical connections according to one embodiment of the present invention. The above-mentioned first lower vertical connection 124, second lower vertical connections 125, and vertical connection 128 can be arranged according to the embodiment of FIG. 3. The above-mentioned upper vertical connections 127 and vertical connection 128 can be arranged according to the embodiment of FIG. 3.

As shown in FIG. 3, a plurality of vertical connections 32 of a chip package can be arranged in two rows such that the plurality of vertical connections 32 will not use too much area from the die of the chip package. Two adjacent vertical connections 32 can be separated in such a manner that one vertical connection 32 is located outside of the keep-out zone 31 of another vertical connection 32. In one embodiment, the plurality of vertical connections 32 are arranged into a matrix having more than three rows and three columns.

Alternatively, a portion of one vertical connection 32 can be within the keep-out zone 31 of an adjacent vertical connection 32 so that the plurality of vertical connections 32 can be arranged more compactly.

Figure 4:
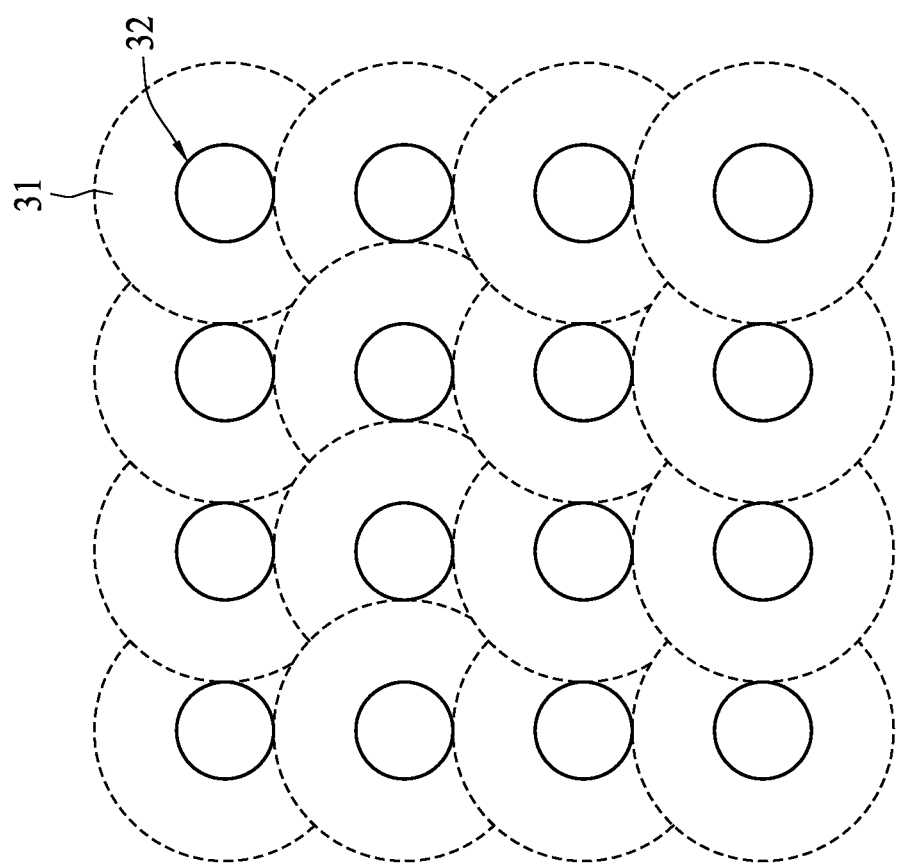
FIG. 4 schematically shows the arrangement of a plurality of vertical connections according to another embodiment of the present invention.

FIG. 4 schematically shows the arrangement of a plurality of vertical connections according to another embodiment of the present invention. The above-mentioned first lower vertical connection 124, second lower vertical connections 125, and vertical connection 128 can be arranged according to the embodiment of FIG. 4. The above-mentioned upper vertical connections 127 and vertical connection 128 can be arranged according to the embodiment of FIG. 4.

Referring to FIG. 4, the plurality of vertical connections 32 of a chip package can be arranged into a square matrix. Thus, the plurality of vertical connections 32 use less area than the vertical connections arranged in one dimension. Similarly, two adjacent vertical connections 32 can be separated in such a manner that one vertical connection 32 is located outside of the keep-out zone 31 of another vertical connection 32. Alternatively, a portion of one vertical connection 32 can be within the keep-out zone 31 of an adjacent vertical connection so that the plurality of vertical connections 32 can be arranged more compactly.

Figure 5A:
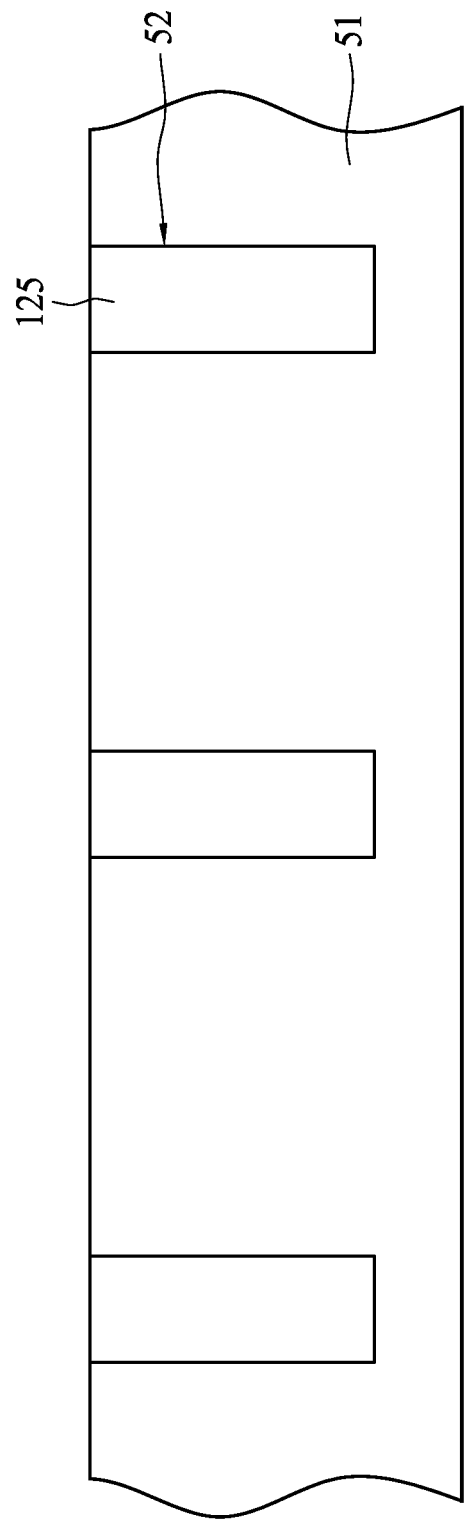
FIGS. 5A through 5D are schematic views for demonstrating a method for forming a semiconductor device of a chip package according to one embodiment of the present invention.

FIGS. 5A through 5D are views for demonstrating a method for forming a semiconductor device of a chip package according to one embodiment of the present invention. Referring to FIG. 5A, a plurality of holes 52 are formed in a substrate or a bottom layer 51 by an etch method or a laser drill method. In one embodiment, the plurality of holes 52 are arranged in a two-dimensional manner. In one embodiment, the plurality of holes 52 are arranged in a matrix. In one embodiment, the plurality of holes 52 are arranged in a ring. In one embodiment, the plurality of holes 52 are arranged in a spiral shape. In one embodiment, the plurality of holes 52 are arranged in a plurality of concentric rings. Thereafter, conductive material, which can be tungsten or another suitable material, fills into the plurality of holes 52 to form a plurality of lower vertical connections 125.

Figure 5B:
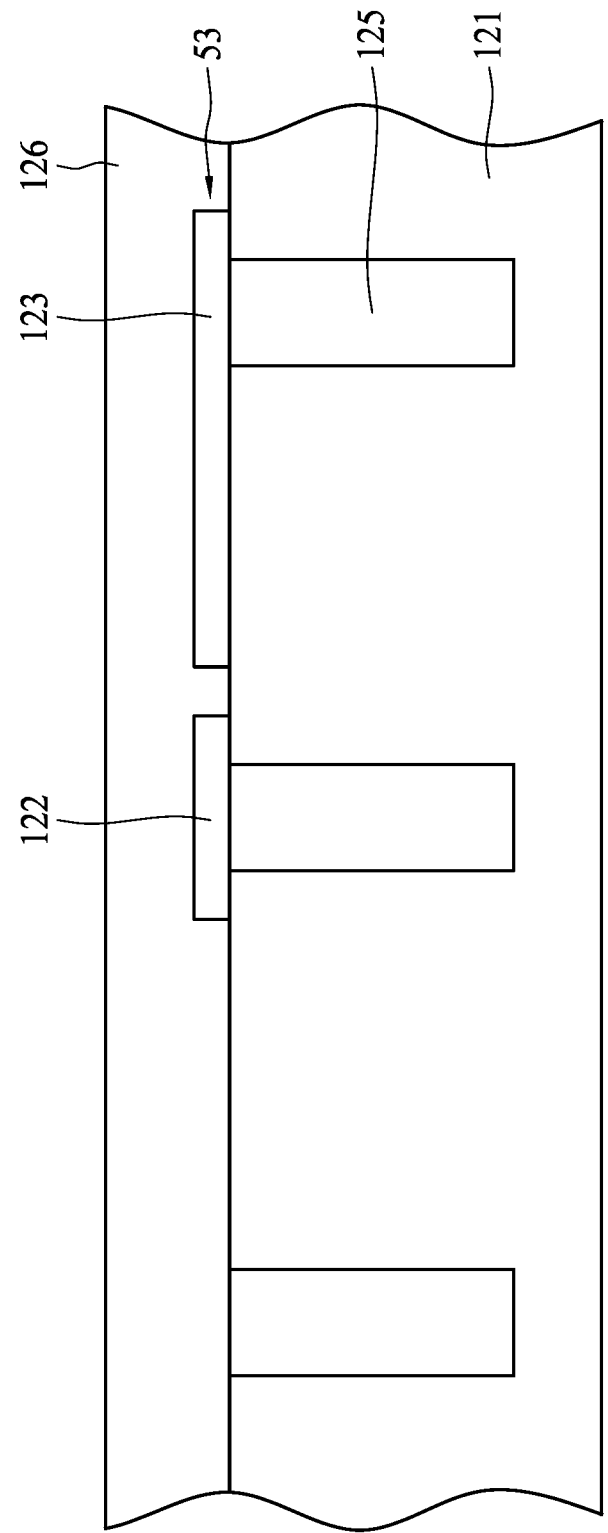

As shown in FIG. 5B, a metal layer 53, including copper, tungsten, or other suitable materials, is formed on the bottom layer 51, and then patterned to form at least one chip select pad 123 and a chip select terminal 122 by lithography and etching processes, wherein each of the at least one chip select pad 123 and the chip select terminal 122 connects to a corresponding lower vertical connection 125, and each chip select pad 123 further extends toward an adjacent vertical connection 125. Thereafter, an insulating layer 126 is applied to cover the at least one chip select pad 123 and the chip select terminal 122.

Figure 5C:
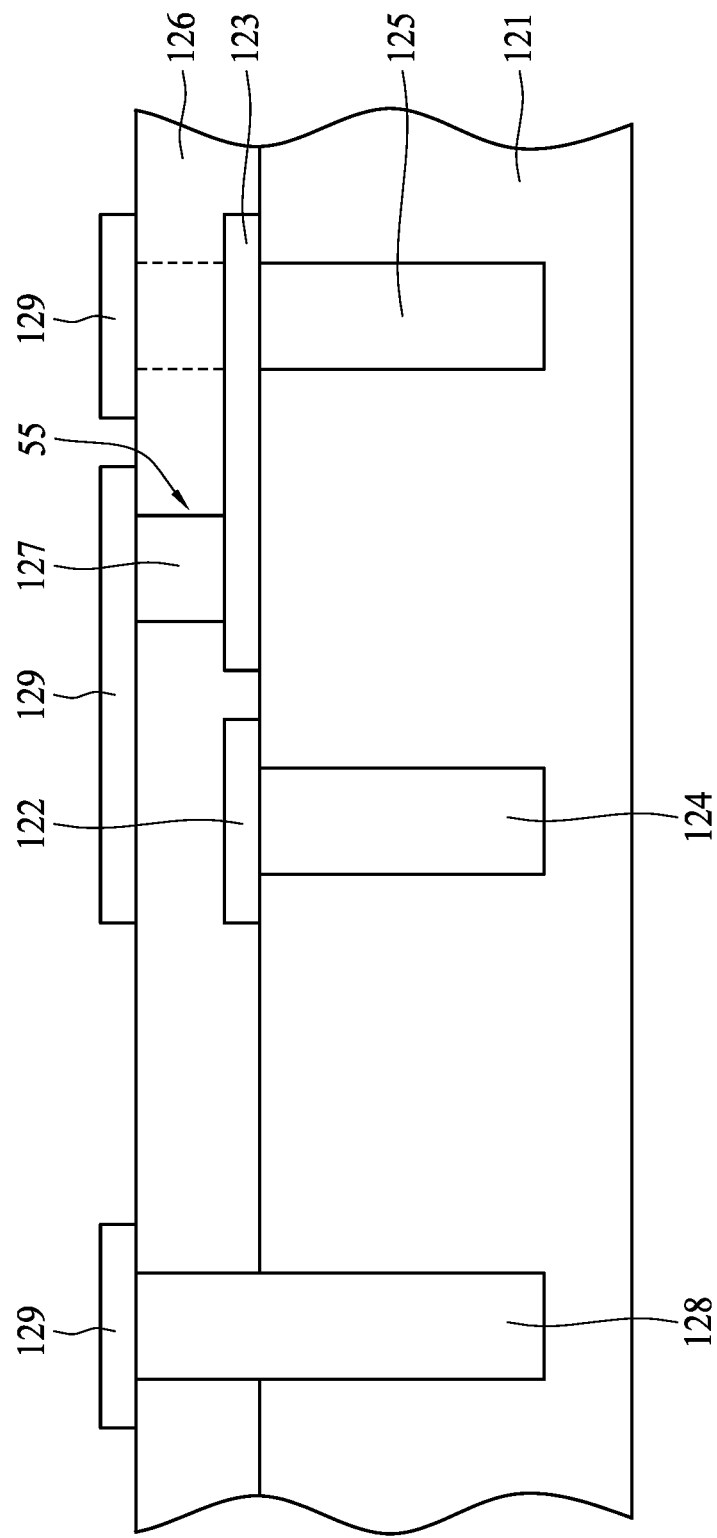

Referring to FIG. 5C, a plurality of holes 55 corresponding to the at least one chip select pad 123 and one lower vertical connection 125, which does not connect to any chip select pad 123, are formed in the insulating layer 126. Each hole 55 is configured to at least partially expose an end portion of a chip select pad 123 opposite to another end portion where the chip select pad 123 connects to a corresponding vertical connection 125, or to expose an upper end of the lower vertical connection 125 that does not connect to any chip select pad 123.

In one embodiment, the plurality of holes 55 are arranged in a two-dimensional manner. In one embodiment, the plurality of holes 55 are arranged in a matrix. In one embodiment, the plurality of holes 55 are arranged in a ring. In one embodiment, the plurality of holes 55 are arranged in a spiral shape. In one embodiment, the plurality of holes 55 are arranged in a plurality of concentric rings.

Subsequently, conductive material such as, but not limited to, tungsten is filled into the plurality of holes 55 to obtain a plurality of upper vertical connections 127 and a vertical connection 128 formed from the bottom layer 51 and through the insulating layer 126.

Thereafter, a metal layer is formed on the insulating layer 126 by depositing material such as copper, tungsten, and other suitable materials, and patterned to form a plurality of conductor 129, wherein each of the upper vertical connections 127 and the vertical connection 128 connects to a corresponding conductor 129.

Figure 5D:
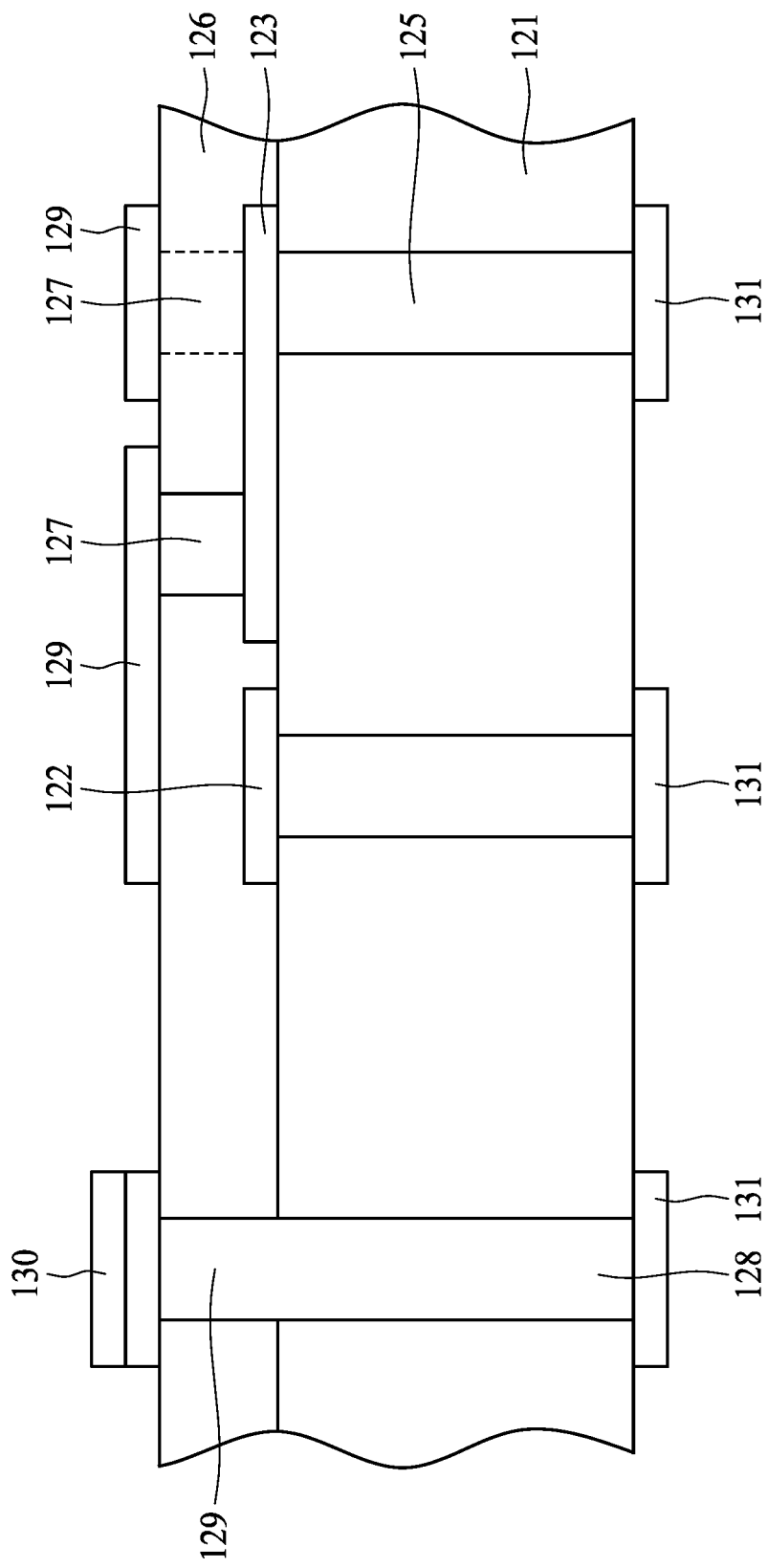

Referring to FIG. 5D, an insulation pad 130 is formed on the conductor 129 connected with the vertical connection 128. The insulation pad 130 can be patterned to only cover a portion of the conductor 129.

Next, the bottom layer 51 is thinned to expose ends of the lower vertical connections 125 and the vertical connection 128. The vertical connection 128 goes straight through the substrate 121 and the insulation layer 126 or through the die of the semiconductor device.

Moreover, a plurality of conductive pads 131 are formed on the substrate 121. The plurality of conductive pads 131 correspondingly connect to the lower vertical connections 125 and the vertical connection 128.

Figure 6:
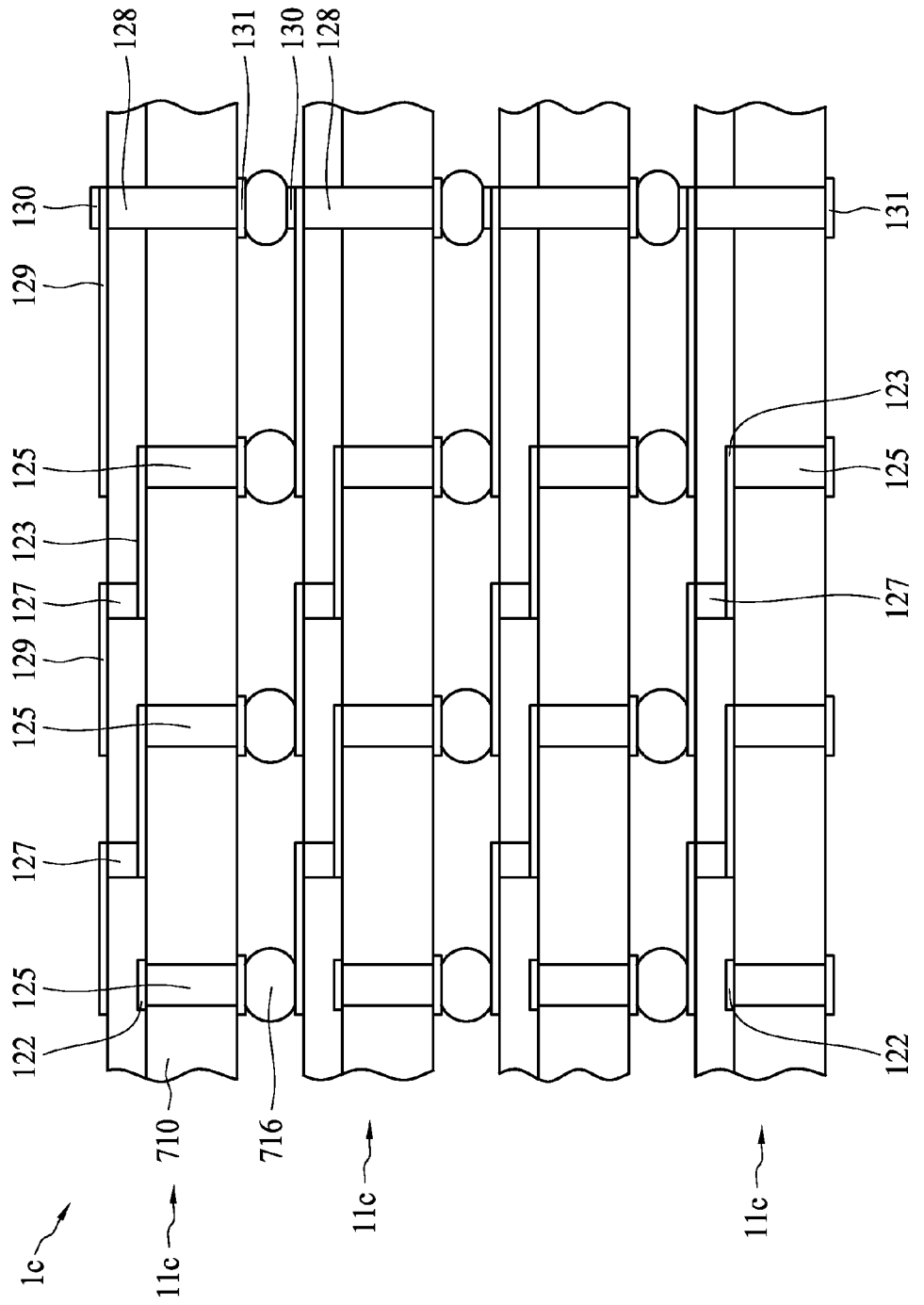
FIG. 6 schematically shows a semiconductor device of a chip-stack package according to another embodiment of the present invention.

FIG. 6 schematically shows stacking semiconductor devices 11c of a chip-stack package 1c according to another embodiment of the present invention. Referring to FIG. 6, the chip-stack package 1c may comprise a plurality of stacked semiconductor devices 11c. Each semiconductor device 11c comprises a plurality of lower vertical connections 125, a plurality of upper vertical connections 127 and at least one vertical connection 128 going directly through the die 710 of the semiconductor device 11c. The vertical connections 127 and the vertical connections 125 can be formed at different levels. One lower vertical connection 125 connects to the chip select terminal 122 that is used to enable the corresponding semiconductor device 11c. A plurality of chip select pads 123 are formed within the die 710, and each chip select pad 123 connects one vertical connection 127 and one lower vertical connection 125. A plurality of conductors 129 are formed on the die 710, and each connector 129 connects to one vertical connection 127 or the vertical connection 128.

An insulation pad 130 can be formed on the conductor 129 connected with the vertical connection 128. Moreover, the vertical connections 125 and the vertical connection 128 each connect to corresponding conductive pads 131 formed on a surface of the corresponding semiconductor device 11c opposite the conductors 129. Bumps 716 may be further formed to electrically connect two stacked semiconductor device 11c. As shown in FIG. 6, bumps 716 may correspond to the conductive pads 131, and each bump 716 connects one conductive pad 131 to one conductor 129 or the insulation pad 130.

In another embodiment, within two adjacent stacking semiconductor devices, the conductors 129 of the lower semiconductor device electrically connect to the corresponding lower vertical connections 125 of the upper semiconductor device by soldering or by using an anisotropic conductive adhesive. When a signal is applied to one lower vertical connection 125 or the vertical connection 128 of the lowest semiconductor device, one corresponding semiconductor device in stack can be enabled.

A plurality of semiconductor devices can then be stacked on a circuit board.

In some embodiments, a semiconductor device comprises a chip, which has a plurality of vertical connection paths through the chip. Each vertical connection path connects an external terminal on one surface of the chip and an external terminal on an opposite surface of the chip, and includes a TSV. The plurality of TSVs can be arranged adjacent to each other and in a two-dimensional manner so that the plurality of TSVs use less area in comparison with a conventional device having similar TSVs, which are arranged in a line, and more semiconductor devices can be stacked together without significantly increasing the size of the chip package. In some embodiments, one of the plurality of vertical connection paths comprises a vertical connection that goes straight between two corresponding external terminals.

Although the present invention and its advantages have been described in detail, it should be understood that various changes, substitutions and alterations could be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a chip package comprising:
    forming a first lower vertical connection, a plurality of second lower vertical connections and a third lower vertical connection in a substrate of at least one semiconductor device;
    forming a chip select terminal and a plurality of chip select pads on the substrate, wherein the chip select terminal connects to the first lower vertical connection, and wherein the plurality of chip select pads correspondingly connect to the plurality of second lower vertical connections;
    forming an insulation layer on the substrate;
    forming a plurality of upper vertical connections in the insulation layer, wherein the plurality of upper vertical connections correspondingly connect to the plurality of chip select pads and the third lower vertical connection, and in which the third lower vertical connection and a corresponding one of the upper vertical connections form a vertical through connection that goes straight through the substrate and the insulation layer;
    forming a plurality of conductors on the insulation layer, wherein the plurality of conductors correspondingly connect to the plurality of upper vertical connections and the vertical through connection; and
    forming an insulation pad on one of the plurality of conductors, wherein the one of the plurality of conductors on which the insulation pad is formed connects with the vertical through connection,
    wherein the first lower vertical connection, the plurality of second lower vertical connections and the third lower vertical connection are arranged in two dimensions, and
    wherein a maximum width of the insulation pad is substantially the same as a maximum width of the vertical through connection.

2. The method of claim 1, wherein at least two of the plurality of conductors extend in different directions.

3. The method of claim 1, wherein at least two of the plurality of conductors extend perpendicularly to each other.

4. The method of claim 1, wherein the first lower vertical connection, the plurality of second lower vertical connections and the third lower vertical connection are arranged in a matrix.

5. The method of claim 1, wherein the first lower vertical connection, the plurality of second lower vertical connections and the third lower vertical connection are arranged in a ring.

6. The method of claim 1, wherein the first lower vertical connection, the plurality of second lower vertical connections and the third lower vertical connection are arranged in a spiral shape.

7. The method of claim 1, wherein one of two adjacent ones of the first lower vertical connection, the plurality of second lower vertical connections and the third lower vertical connection is located outside of a keep-out zone of the other one of the two adjacent ones of the first lower vertical connection, the plurality of second lower vertical connections and the third lower vertical connection.

8. The method of claim 1, wherein a portion of one of two adjacent ones of the first lower vertical connection, the plurality of second lower vertical connections and the third lower vertical connection is located in a keep-out zone of the other one of the two adjacent ones of the first lower vertical connection, the plurality of second lower vertical connections and the third lower vertical connection.

9. The method of claim 1, wherein the at least one semiconductor device is provided as a plurality of semiconductor devices, and further comprising:
    stacking the plurality of semiconductor devices to form a plurality of stacked semiconductor devices, wherein in two adjacent ones of the stacked semiconductor devices, the conductors of a lower one of the two adjacent ones of the stacked semiconductor devices are correspondingly connected with the first lower vertical connection and the second lower vertical connections of an upper one of the two adjacent ones of the stacked semiconductor devices by soldering or by using an anisotropic conductive adhesive.

10. The method of claim 1, wherein the maximum width of the insulation pad is smaller than a maximum width of the one of the plurality of conductors on which the insulation pad is formed.

* * * * *